(12) United States Patent
van der Heijden et al.

(10) Patent No.: US 8,594,604 B2
(45) Date of Patent: Nov. 26, 2013

(54) FRINGE CAPACITOR CIRCUIT

(75) Inventors: Edwin van der Heijden, Eindhoven (NL); Lukas Frederik Tiemeijer, Eindhoven (NL); Maristella Spella, Tilburg (NL)

(73) Assignee: NXP, B.V., Eindhoven (NL)

(*) Notice: Subject to any disclaimer, the term of this patent is extended or adjusted under 35 U.S.C. 154(b) by 1012 days.

(21) Appl. No.: 12/641,858

(22) Filed: Dec. 18, 2009

(65) Prior Publication Data

US 2011/0151803 A1 Jun. 23, 2011

(51) Int. Cl.
*H04B 1/10* (2006.01)

(52) U.S. Cl.
USPC ........... 455/307; 455/280; 455/293; 455/311; 455/334; 455/338; 455/339; 361/301.1; 361/301.4; 361/306.1; 361/306.3; 361/307; 361/308.1; 257/303; 257/306; 257/307; 257/308; 438/239; 438/253; 438/256

(58) Field of Classification Search
USPC ............... 455/78, 80, 81, 280, 281, 283, 292, 455/293, 296, 307, 311, 334, 338, 339; 361/301.1, 301.4, 306.1, 306.3, 307, 361/308.1, 312, 313; 257/301, 303, 306, 257/307, 308, 310, 313; 438/239, 240, 253, 438/256
See application file for complete search history.

(56) References Cited

U.S. PATENT DOCUMENTS

| | | | | |
|---|---|---|---|---|
| 6,661,638 B2 * | 12/2003 | Jackson et al. | ................ | 361/303 |
| 7,088,962 B2 * | 8/2006 | Anand et al. | .................... | 455/76 |
| 7,161,228 B1 | 1/2007 | Pettit | | |
| 7,305,643 B2 * | 12/2007 | McClellan et al. | ........... | 716/112 |
| 7,863,666 B2 * | 1/2011 | Liu | ................................ | 257/308 |
| 7,873,191 B2 * | 1/2011 | Bach | ............................. | 382/124 |
| 7,902,583 B2 * | 3/2011 | Liu | ................................ | 257/307 |
| 8,238,862 B2 * | 8/2012 | Mirzaei et al. | ................ | 455/293 |
| 2008/0151469 A1 * | 6/2008 | Thompson et al. | ........... | 361/303 |

FOREIGN PATENT DOCUMENTS

| | | |
|---|---|---|
| WO | 2008/004151 A2 | 1/2008 |
| WO | 2009/044464 A1 | 4/2009 |

* cited by examiner

*Primary Examiner* — Tuan A Tran

(57) ABSTRACT

Capacitive circuits are implemented with desirable quality factors in various implementations. According to an example embodiment, a fringe capacitor includes two capacitive circuits (e.g., plates), respectively having a plurality of capacitive fingers extending from an end structure, and respectively having a connecting pin that is adjacent the connecting pin of the other capacitive circuit, on a common side fringe capacitor. The capacitive fingers are arranged in stacked layers, with vias connecting the fingers in different layers back to the connecting pins.

13 Claims, 7 Drawing Sheets

FRINGE CAPACITOR CIRCUIT

FIELD OF THE INVENTION

The present invention relates generally to capacitive circuits, and more specifically to a fringe capacitor circuit.

BACKGROUND

Capacitive circuits are used in a multitude of applications, to serve various needs. For example, fringe capacitors are often used in CMOS applications as integrated capacitor with low parasitics to ground.

Radio frequency (RF) circuits exemplify one such type of circuit that uses fringe capacitors. At microwave frequencies, the quality of passives and interconnects is important for the RF circuit performance. Many fringe capacitors use stacked fingers with small finger width and pitch, creating a lateral capacitance between the fingers, and the fingers are placed on top of an N-well.

While fringe capacitors have been useful, their implementation with many applications has been challenging. For example, with RF circuit applications involving microwave frequencies, fringe capacitors often underperform for one or both of single-ended mode and differential mode operation, due to limited quality factor of the fringe capacitor at such microwave frequencies. Due to a variety of factors such as current path length and shrinkage of the lowest metal layers in advanced CMOS processes, these metals exhibit high loss and inductance, which can result in a drop in the quality factor of a fringe capacitor at high (e.g., microwave) frequencies. Accordingly, previous fringe capacitors have exhibited a low quality factor beyond 60 GHz (e.g., less than 10), and the capacitance between connecting pins of the fringe capacitor increases as a function of frequency (e.g., from 95 fF (low frequency) to 115 fF (60 GHz)).

These and other issues continue to present challenges to the implementation of capacitive circuits.

SUMMARY

The present invention is exemplified in a number of implementations and applications, some of which are summarized below.

Consistent with an example embodiment of the present invention, a semiconductor-based capacitive device includes a substrate and respective capacitor circuits (e.g., plates) that form a fringe capacitor. The first and second capacitive circuits respectively include a plurality of finger-like extensions in at least one metal layer of the device, and a dielectric material separates the finger-like extensions. Each capacitive circuit includes a connecting pin, the respective connecting pins being located adjacent one another on a common side of the capacitive circuits.

Another example embodiment is directed to one or more components of a media communications system. The system includes a media presentation device that receives and presents at least one of audio and video data to a user. A media source device communicates at least one of the audio and video data to the media presentation device. Each of the media source device and the media presentation device respectively has a fringe capacitor as part of a transceiver circuit that sends and receives the at least one of audio and video data. The fringe capacitor includes first and second capacitive circuits respectively having a plurality of finger-like extensions in at least one metal layer of the device, a dielectric material separating the finger-like extensions, and a connecting pin. The respective connecting pins are located adjacent one another on a common side of the capacitive circuits.

Other example embodiments are directed to methods of operating circuits with fringe capacitors, and/or various circuits employing fringe capacitors in accordance with one or more approaches as discussed herein.

The above summary is not intended to describe each embodiment or every implementation of the present disclosure. The figures and detailed description that follow more particularly exemplify various embodiments.

BRIEF DESCRIPTION OF THE DRAWINGS

The invention may be more completely understood in consideration of the following detailed description of various embodiments of the invention in connection with the accompanying drawings, in which.

Figure 1:
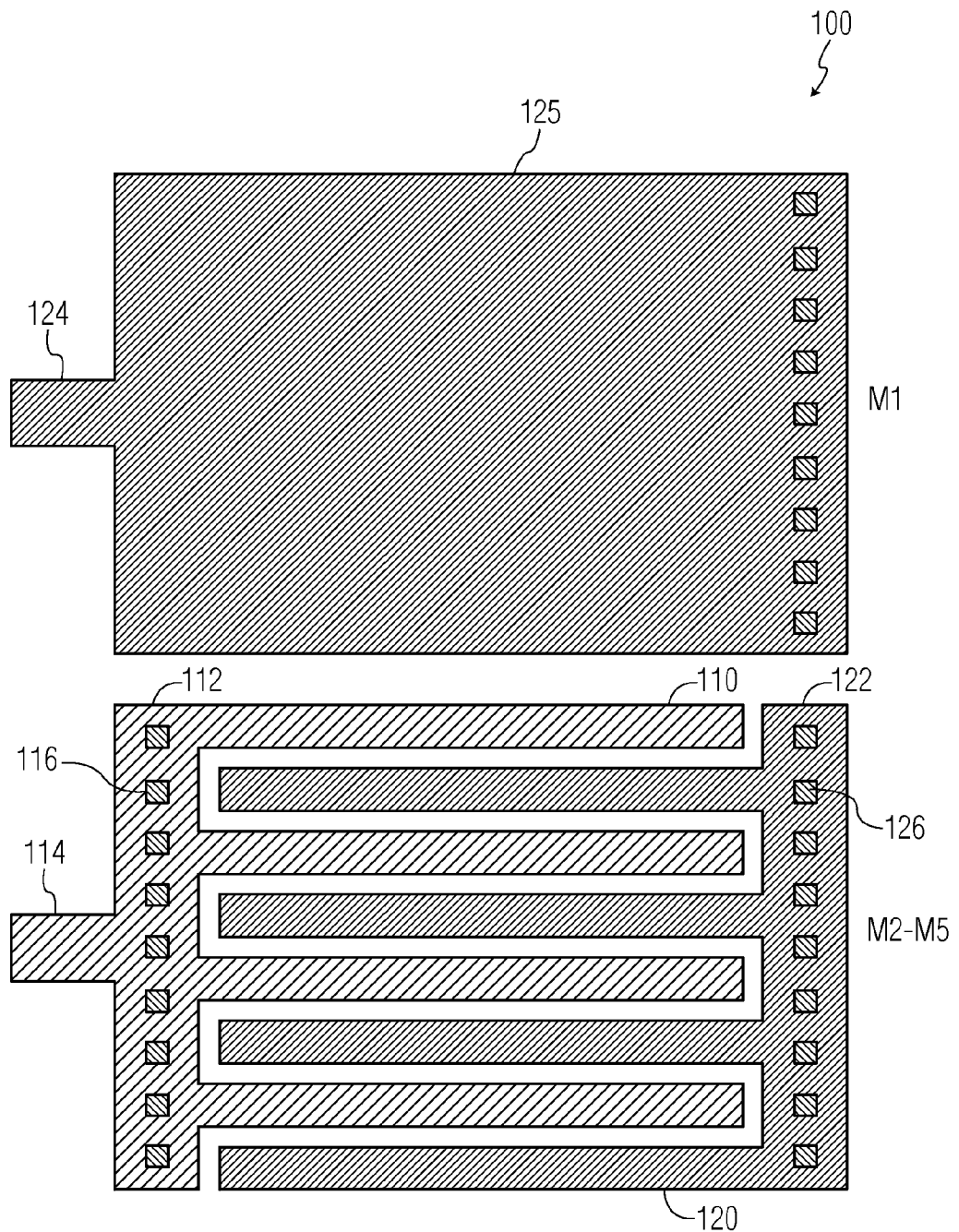
FIG. 1 shows a fringe capacitor circuit with layered sets of finger-like extensions and a return path, in accordance with one or more example embodiments of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

DETAILED DESCRIPTION

The present invention is believed to be applicable to a variety of different capacitive circuits, devices and arrangements for use with many circuit applications. While the present invention is not necessarily so limited, various aspects of the invention may be appreciated through a discussion of examples using this context.

In connection with various example embodiments, a fringe capacitor includes opposing capacitive circuits respectively operating as plates of a capacitor, each circuit having a plurality of conductive finger-type structures that are separated from the finger-type structures of the other capacitive circuit by a dielectric-type material. Each capacitive circuit includes a connecting pin that is electrically connected to the fingers. The connecting pins of each capacitive circuit are respectively located adjacent to one another and on a common side of the fringe capacitor. The conductive finger-type structures are in a defined arrangement (e.g., capable of modeling via parasitic extraction tools), and the connecting pins are arranged to limit the current path beyond that in the defined structure. Accordingly, undesirable capacitance characteristics, including those discussed in the Background above, can be mitigated.

The location of the connecting pins on the common fringe capacitor side varies, depending upon the implementation. In some embodiments, the pins are in a common metal layer, and in other embodiments, the pins are in different metal layers (e.g., vertically-adjacent layers separated by the dielectric). The device accordingly has one or more metal layers that include conductive finger-type structures for each capacitive circuit.

Turning now to the Figures, FIG. 1 shows a fringe capacitor 100 with layered sets of finger-like extensions and connecting pins (114, 124), according to another example embodiment. The upper and lower portions of FIG. 1 represent different metal layers of a semiconductor device that form a fringe capacitor, with the upper portion showing a first layer that forms a return path 125 to the connecting pin 124, and the lower portion showing one or more additional layers over the first layer. For example, the first (return path) layer can be formed in a first metal layer (e.g., MD of a semiconductor device, and the additional layers can be formed in additional metal layers (e.g., M2-M5) of a semiconductor device.

Each of the (one or more) layers over the first layer includes a plurality of finger-like extensions for each of two capacitive circuits (e.g., often referred to as plates) that make up the fringe capacitor 100. Finger 110 is part of a first capacitive circuit that includes the connecting pin 114, and finger 120 is part of a second capacitive circuit that includes connecting pin 124. The respective fingers 110 and 120 extend from end portions 112 and 122 of the capacitive circuits, from which additional fingers in the capacitive circuits extend. The fingers of each capacitive circuit or plate are arranged in an alternating arrangement as shown. Each capacitive circuit thus includes a plurality of fingers extending from an end portion (e.g., in a comb-type arrangement), arranged in one or more layers over the first layer, which includes the return path 125.

For each of the capacitive circuits, portions that are in different layers are connected to one another by vias. By way of example, via 116 connects layers of the capacitive circuit including finger 110, end 112 and pin 114. Similarly, via 126 connects layers of the capacitive circuit including finger 120, end 122 and pin 124. The vias (as shown) thus connect ends to one another for a common one of the respective capacitive circuits, with the ends of each capacitive circuit being on opposite sides of the fringe capacitor 100. To permit locating the connecting pin 124 back to the same side as connecting pin 114, end 122 is connected to the return path 125.

Each of the respective connecting pins 114 and 124 are located adjacent one another on a common side of the fringe capacitor 100, as facilitated via the return path 125 in the first layer of the device, in one or more arrangements. As shown, the pins 114 and 124 are positioned near the center portion of one side of the fringe capacitor, but can be offset relative to one another for various applications. In some implementations, the connecting pins 114 and 124 are placed in metal layers that are close to one another (e.g., separated from one another by a dielectric layer). In other implementations, the connecting pins are separated by one or more metal layers, or include two or more interconnected pins coupled between layers.

Figure 2A:
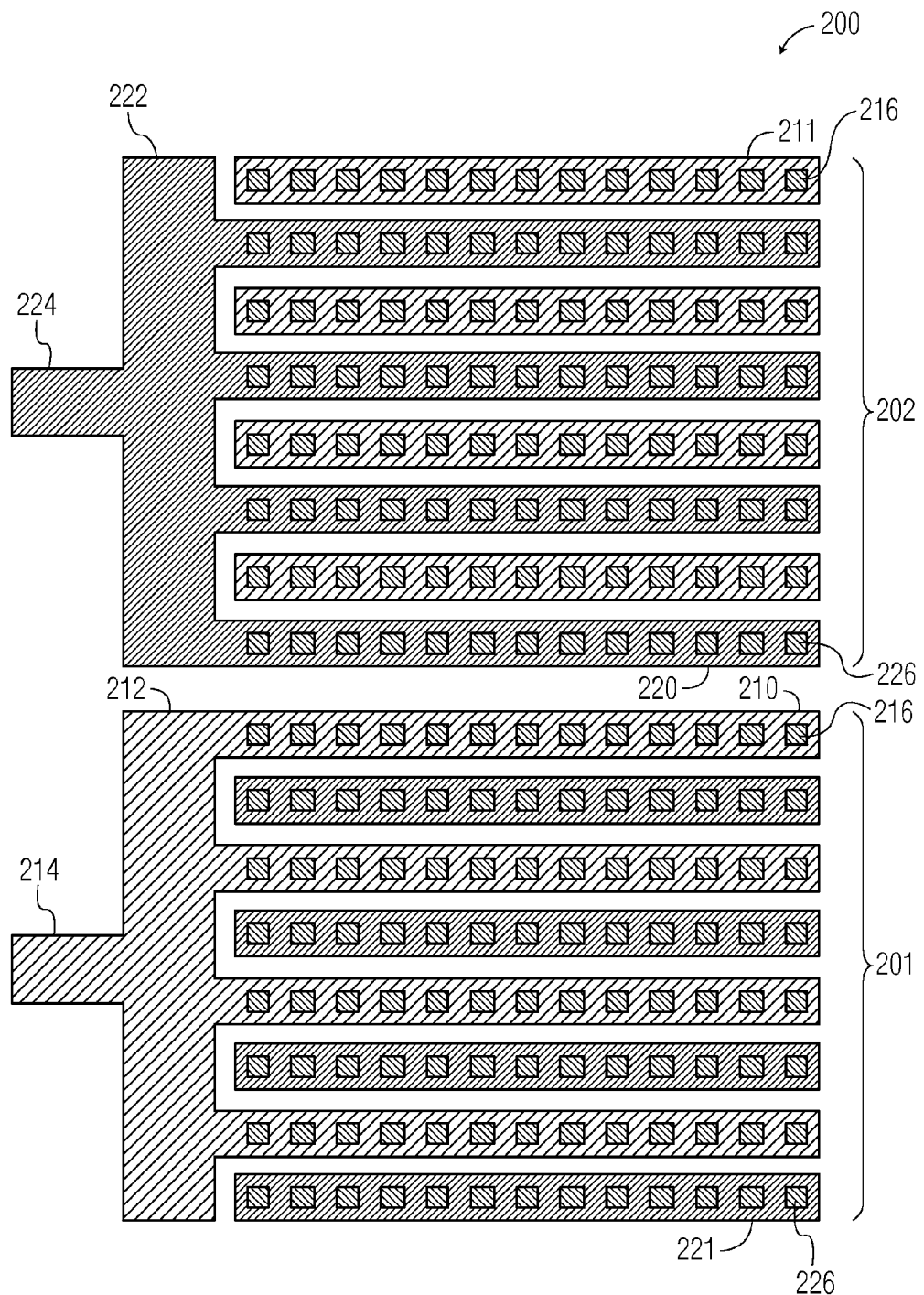
FIG. 2A shows a fringe capacitor circuit with layered sets of finger-like extensions and connection pins in different layers, in accordance with one or more example embodiments of the present invention.

FIG. 2A shows a fringe capacitor circuit 200 with sets of finger-like extensions and connection pins in different layers, in accordance with other example embodiments of the present invention. The circuit 200 has a plurality of layers including at least two alternating layers 201 and 202 as shown, which form first and second capacitive circuits (e.g., plates) of the fringe capacitor, where the respective layers can be arranged in parallel with one another, such as by locating the layers on top of one another in a semiconductor device.

A first one of the capacitive circuits includes components in at least two layers. In layer 201, the first capacitive circuit includes a plurality of alternating fingers including finger 210 coupled to end 212, and a connecting pin 214. The first capacitive circuit also includes alternating fingers in layer 202, including finger 211. The fingers 210 and 211 are coupled by a plurality of vias, including via 216, that extend between the layers.

A second one of the capacitive circuits includes components in at least two layers as well, with a plurality of alternating fingers including finger 220 coupled to end 222 and a connecting pin 214 in layer 202. The second capacitive circuit also includes alternating fingers in layer 201, including finger 221. The fingers 220 and 221 are coupled by a plurality of vias, including via 226, that extend between the layers. Each capacitive circuit includes a plurality of alternating fingers in each layer, extending from an end as shown and/or coupled to corresponding fingers in another layer.

Figure 2B:
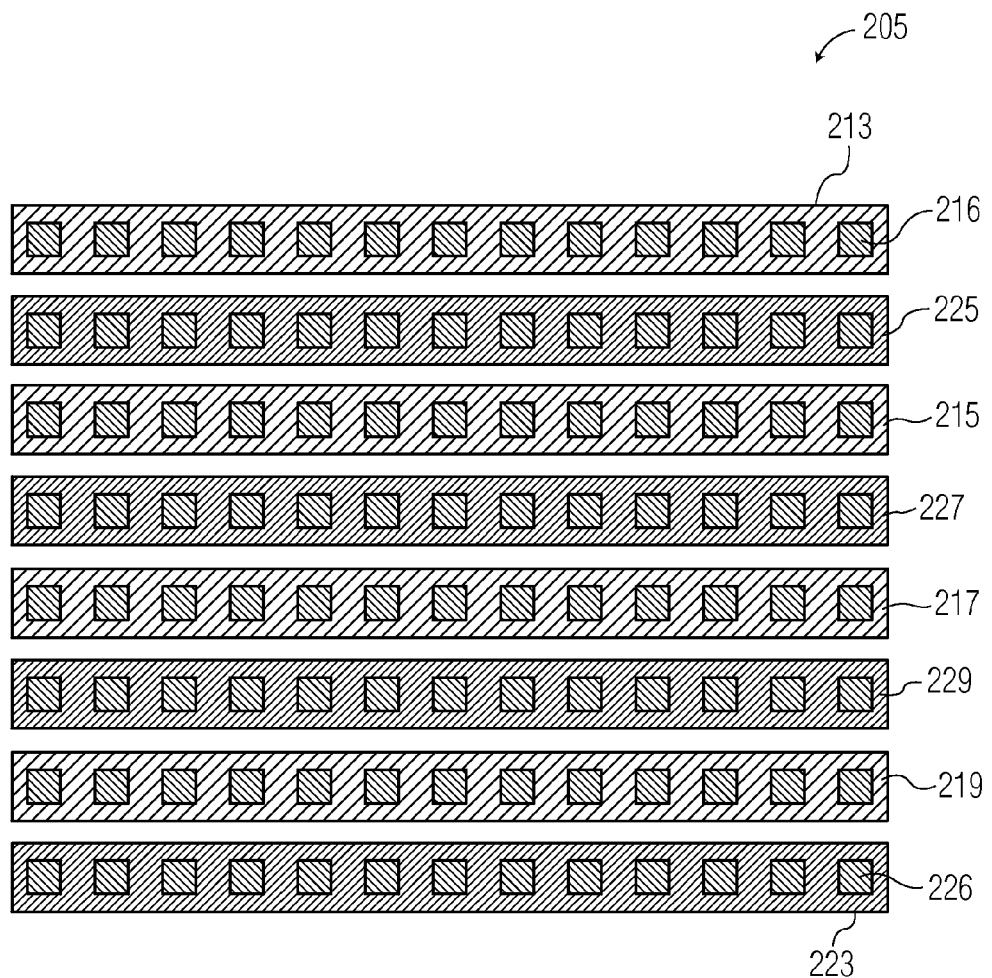
FIG. 2B shows a fringe capacitor circuit layer that may be implemented in connection with the fringe capacitor shown in FIG. 2A, in accordance with another example embodiment of the present invention.

Additional layers may be formed in a manner similar to that shown in FIG. 2A, with stacked versions of the fingers (e.g., one or more fingers over fingers 210 and 211), and/or stacked ends and connecting pins as appropriate. FIG. 2B shows one such additional fringe capacitor circuit layer 205 that may be implemented in connection with the fringe capacitor shown in FIG. 2A, in accordance with another example embodiment of the present invention. The layer 205 includes a plurality of alternating fingers for each of the capacitor circuits (e.g., plates) shown in FIG. 2A, with finger 213 coupled to fingers 210 and 211 by via 216 for the first capacitor circuit, and with finger 223 coupled to fingers 220 and 221 by via 226 for the second capacitive circuit. Additional alternating fingers 215, 217 and 219 are respectively coupled to fingers in the first capacitive circuit by vias therein, and alternating fingers 225, 227 and 229 are respectively coupled to fingers in the second capacitive circuit.

Figure 3:
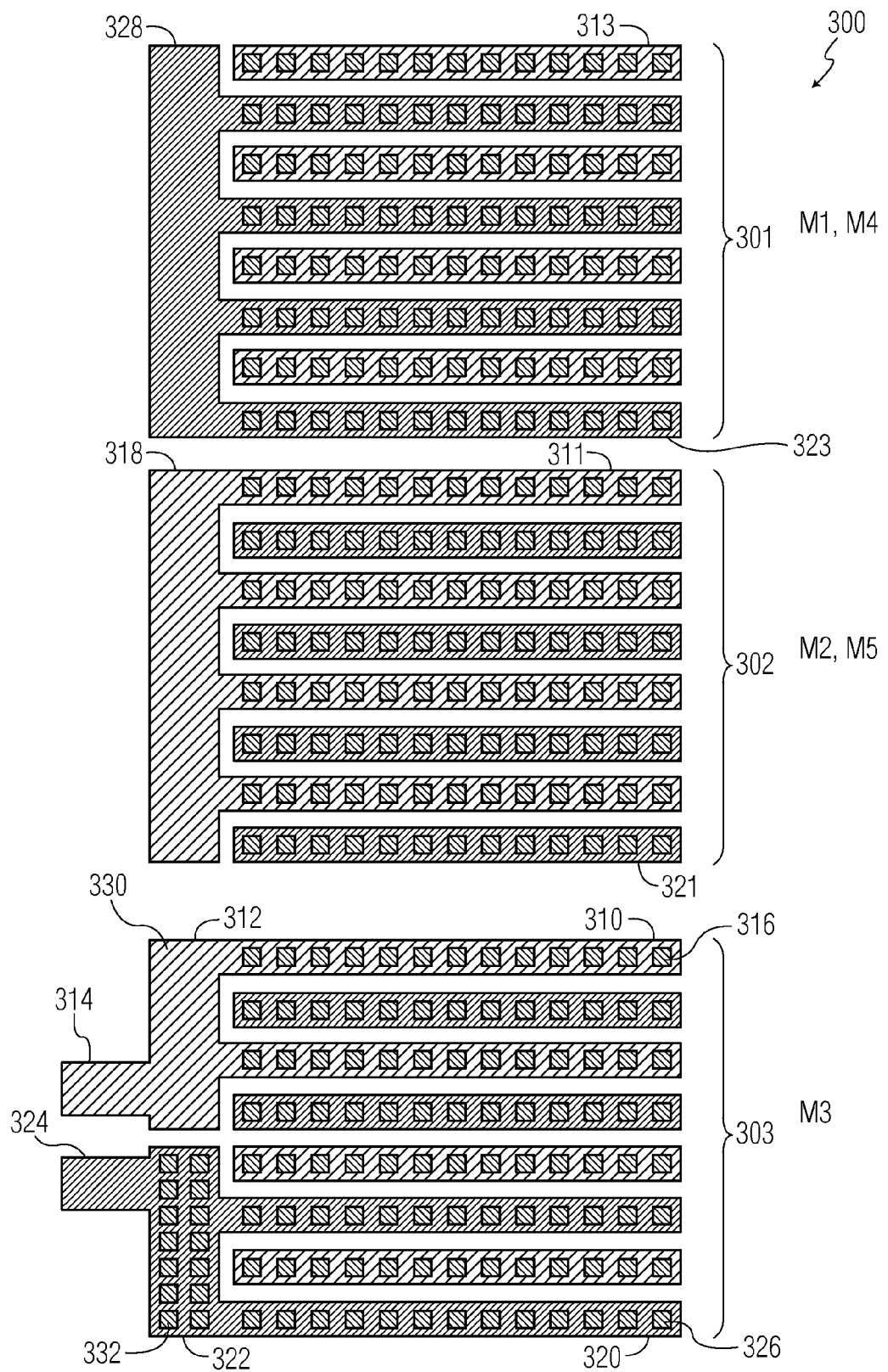
FIG. 3 shows a fringe capacitor circuit with layered sets of finger-like extensions and connection pins in a common layer, in accordance with one or more example embodiments of the present invention.

FIG. 3 shows a fringe capacitor circuit 300 with layered sets of finger-like extensions and connection pins in a common layer, in accordance with one or more example embodiments of the present invention. The fringe capacitor 300 includes a plurality of layers arranged in parallel as shown, with layer 303 being a central layer and with at least one of additional layers 301 and 302 respectively located on opposite sides of the central layer. For example, in a five-layer arrangement having metal layers M1-M5 in a semiconductor device, layers M1 and M4 are formed as shown for layer 301, layers M2 and M5 are formed as shown for layer 302, and layer M3 is middle layer 303.

The fringe capacitor 300 includes two capacitive circuits (plates), respectively coupled to connecting pins 314 and 324 in a common layer 303. The first capacitive circuit includes a plurality of alternating fingers coupled to ends 312 and 318, and the second capacitive circuit includes a plurality of alternating fingers coupled to ends 322 and 328. Labeled by way of example, the fingers in the first capacitive circuit include fingers 310, 311 and 313 coupled by vias including via 316 that extend through each layer. Similarly, the fingers in the second capacitive circuit include fingers 320, 321 and 323, with the respective fingers in each layer connected by vias.

Additional vias including via 330 and via 332 respectively couple end 312 with end 318, and end 324 with end 328, in layers M2 and M4. Depending upon the application, additional layers moving away from the central layer 303 (or layers M1 and M5) do not include ends as shown in 310 and 302, and instead are connected though vias in the fingers (e.g., as in FIG. 2B).

Figure 4:
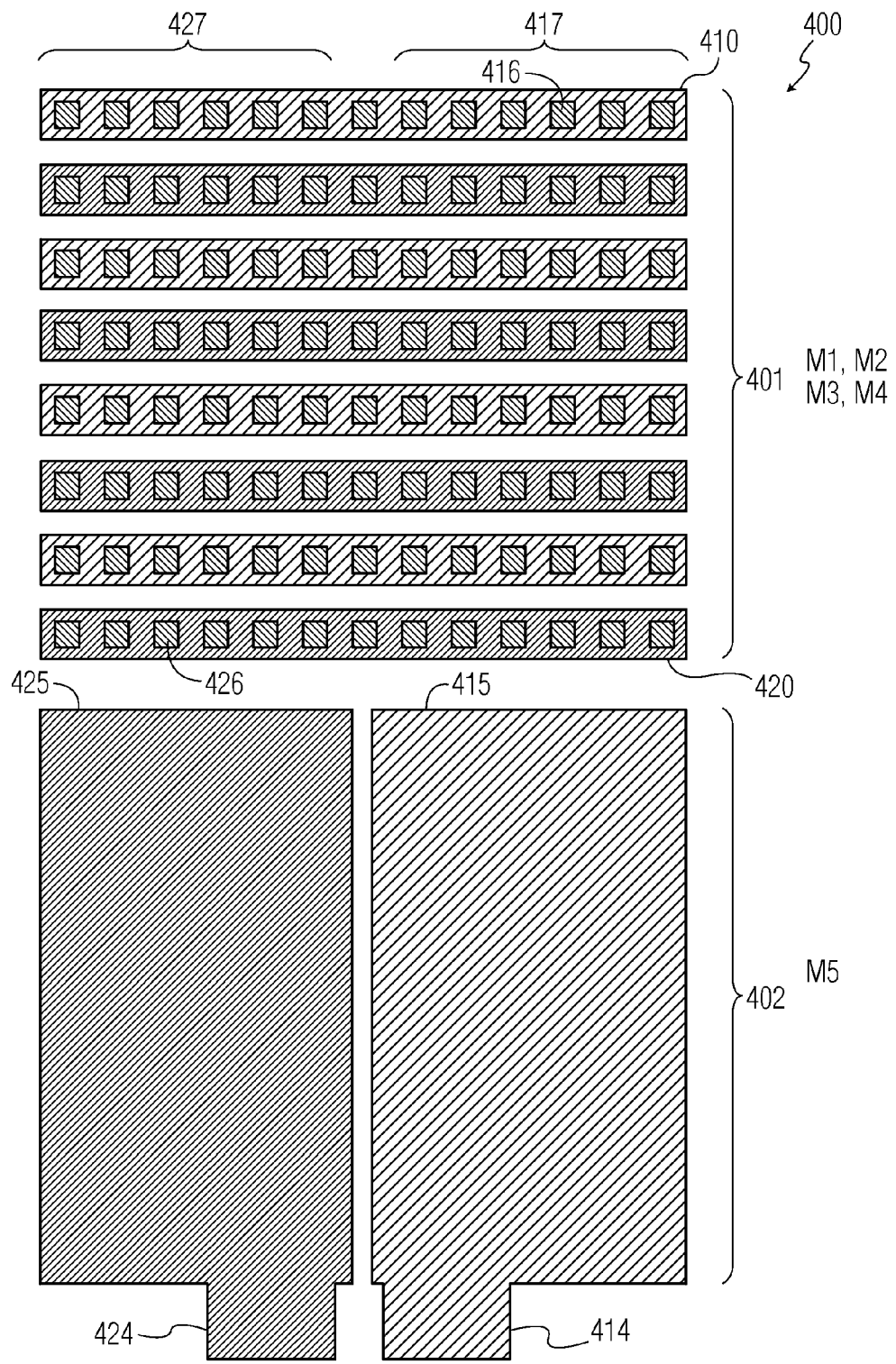
FIG. 4 shows a fringe capacitor circuit with layered sets of finger-like extensions with respective return paths in a common layer, in accordance with one or more example embodiments of the present invention.

FIG. 4 shows a fringe capacitor circuit 400 with layered sets of finger-like extensions with respective return paths in a common layer, in accordance with one or more example embodiments of the present invention. Layer 401 is aligned to layer 402 in parallel (e.g., as stacked metal layers in a semiconductor device), with multiple ones of layer 401 stacked to form larger devices, in different embodiments.

Plates 415 and 425 are respective return paths to connecting pins 414 and 424 in different capacitive circuits (e.g., plates) of the fringe capacitor 400. Plate 415 is coupled to alternating ones of the fingers shown in layer 401, including finger 410, with the fingers in additional layers coupled by vias including via 416. Plate 425 is similarly coupled to alternating ones of the fingers shown in layer 401, including finger 420, with the fingers in additional layers coupled by vias including via 426.

At least some of the vias extend to couple the fingers to the respective return plates 415 and 425 for each capacitive circuit. For instance, vias extending through finger 410 (and alternating fingers forming part of the first capacitive circuit) in region 417 extend to the return plate 415, whereas vias extending through the same fingers at region 427 do not extend to the plate 425. Conversely, vias extending through finger 420 and other alternating fingers forming part of the second capacitive circuit extend to the return plate 425 in region 427, but do not extend to the return plate 415 in region 417. Accordingly, the respective capacitive circuits are maintained separately.

Figure 5:
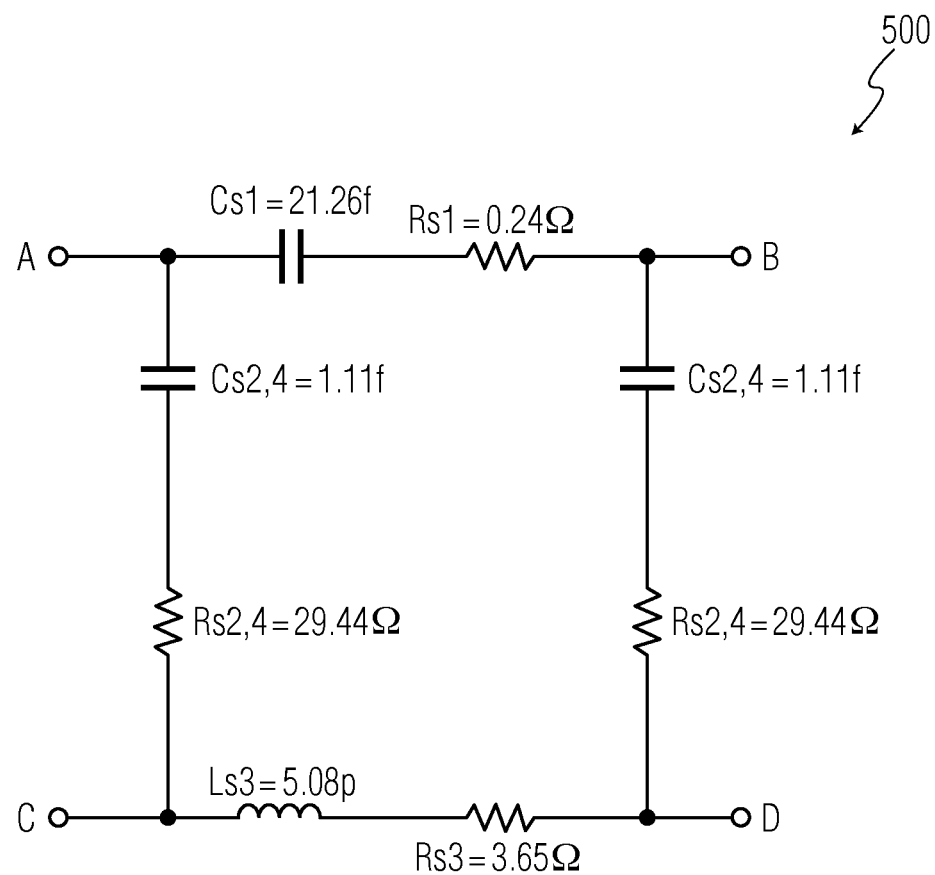
FIG. 5 shows an equivalent network of a fringe capacitor, for implementation with another example embodiment of the present invention.

FIG. 5 shows an equivalent four-port network 500 of a fringe capacitor, for implementation in accordance with another example embodiment of the present invention. Using the equivalent network, a semiconductor-based fringe capacitor design having finger-type structures (such as described above) is simulated as follows for high frequency (e.g., 60 GHz) operation, with:

A=signal in,
B=signal out,
C=ground in, and
D=ground out.

The ground is assumed to be an ideal ground, parasitic capacitances $Cs2$ and series resistances $Rs2$ are ignored (e.g., considered irrelevant to 60 GHz (high impedance) operation), and series (finger) resistance $Rs1$ is considered to be the main contribution to losses. Shunt impedances between nodes A-C and B-D are equal (e.g., $Cs2=Cs4$ and $Rs2=Rs4$). In connection with this embodiment, it has been discovered that the main contribution to losses in the circuit is from the loss in the ground-plane ($Rs3$) and not in the finger resistance ($Rs1$). It has further been discovered that the inductance in the ground-plane ($Ls3$) contributes to increasing equivalent capacitance.

In connection with an example embodiment and the aforesaid discoveries and FIG. 5, a fringe capacitor circuit includes connecting pins arranged to reduce ground-plane loss as relevant to $Rs3$, and mitigate increases in equivalent capacitance via the ground-plane inductance ($Ls3$) as discussed above. The fringe capacitor is configured for single-ended use, where the return path is reduced via adjacent placement of connecting pins, to mitigate degradation in RF performance. Accordingly, and as may be relevant to one or more example embodiments described above, in connection with the figures or otherwise, one or more fringe capacitor circuits is arranged in accordance with this/these discoveries, with connecting pins of respective plates (capacitive circuits) placed in close proximity to one another.

Figure 6:
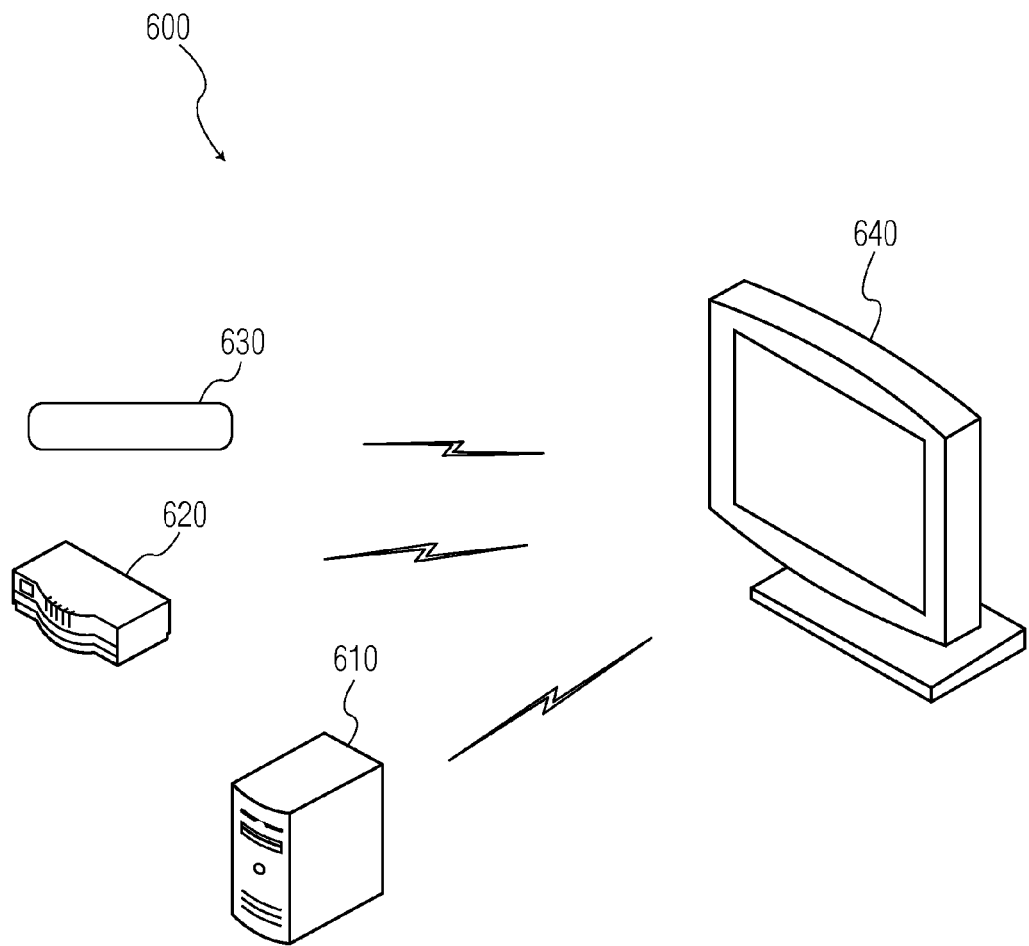
FIG. 6 shows a media communications system, according to another example embodiment of the present invention.

FIG. 6 shows a media communications system 600, according to another example embodiment of the present invention. The system includes a plurality of media sources 610-630, and a media playback device 640 (e.g., a television or audio/video monitor). By way of example, the media sources 610-630 include a computer 610, a router 620 (for wirelessly communicating signals from one or more sources), and a media device 630, such as a satellite or cable television box, or a stored media player (e.g., a DVD player, digital media player, or mobile hand-held device). In addition, while three media sources are shown, fewer or more sources may be used in connection with various implementations.

Each of the media sources 610-630 and the media playback device 640 includes a high-frequency RF wireless communications circuit having a fringe capacitor as described herein. Using this approach, media content such as audio, high-definition video, and images can be communicated wirelessly between devices in a network, such as a home environment.

Based upon the above discussion and illustrations, those skilled in the art will readily recognize that various modifications and changes may be made to the present invention without strictly following the exemplary embodiments and applications illustrated and described herein. Such modifications and changes may include, for example, adding or removing layers as shown, using alternate geometric arrangements or offset layers, using capacitive circuits as described herein in a variety of different applications, many of which involve high-frequency applications (e.g., RF applications, microwave applications, and applications at frequencies at and beyond 10 GHz). One field of applications to which the circuits discussed herein apply includes media communications, processing and presentation, such as applicable to video and audio applications. Other fields of applications involve RF devices, such as may be employed in automotive collision avoidance radar, and other proximity-type applications. These and other modifications do not depart from the true spirit and scope of the present invention, including that set forth in the following claims.

What is claimed is:

1. A semiconductor-based fringe capacitor device comprising:
   a substrate;
   over the substrate, first and second capacitive circuits respectively having a plurality of finger-like extensions in at least one metal layer of the device;
   a dielectric material separating the finger-like extensions; and
   each capacitive circuit having a connecting pin, the respective connecting pins being located adjacent one another on a common side of the capacitive circuits; and wherein
   the finger-like extensions are in at least two metal layers of the device, and
   the connecting pins are located horizontally adjacent one another in a common one of the at least two metal layers.

2. The device of claim 1, wherein the capacitive circuits include finger-like extensions in a common metal layer.

3. The device of claim 1, wherein
   the capacitive circuits include finger-like extensions in a plurality of metal layers, and
   each metal layer is separated by the dielectric material.

4. A semiconductor-based fringe capacitor device comprising:
- a substrate;
- over the substrate, first and second capacitive circuits respectively having a plurality of finger-like extensions in at least one metal layer of the device;
- a dielectric material separating the finger-like extensions; and
- each capacitive circuit having a connecting pin, the respective connecting pins being located adjacent one another on a common side of the capacitive circuits; and wherein
- the capacitive circuits include finger-like extensions in a plurality of metal layers,
- each metal layer is separated by the dielectric material, and
- the connecting pins are located adjacent one another in a common one of the metal layers.

5. The device of claim 4, wherein
- the respective capacitive circuits include finger-like extensions in vertically-adjacent metal layers of the device,
- the metal layers are separated from one another by the dielectric material,
- at least one of the capacitive circuits has finger-like extensions in at least two immediately adjacent ones of the metal layers and coupled to one another by vias extending through the dielectric material between the layers.

6. A semiconductor-based fringe capacitor device comprising:
- a substrate;
- over the substrate, first and second capacitive circuits respectively having a plurality of finger-like extensions in at least one metal layer of the device;
- a dielectric material separating the finger-like extensions; and
- each capacitive circuit having a connecting pin, the respective connecting being located adjacent one another on a common side of the capacitive circuits; and wherein
- the respective capacitive circuits include finger-like extensions in vertically-adjacent metal layers of the device,
- the metal layers are separated from one another by the dielectric material,
- at least one of the capacitive circuits has finger-like extensions in at least two immediately adjacent ones of the metal layers and coupled to one another by vias extending through the dielectric material between the layers, and
- the connecting pins for the first and second capacitive circuits are respectively located in a common one of the vertically-adjacent metal layers.

7. A semiconductor-based fringe capacitor device comprising:
- a substrate;
- over the substrate first and second capacitive circuits respectively having a plurality of finger-like extensions in at least one metal layer of the device;
- a dielectric material separating the finger-like extensions; and
- each capacitive circuit having a connecting pin, the respective connecting pins being located adjacent one another on a common side of the capacitive circuits; and
  - wherein at least one of the capacitive circuits includes a conductive layer return path in a metal layer that is adjacent a metal layer having the finger-like extensions therein.

8. A fringe capacitor comprising:
- a substrate;
- on the substrate, a plurality of stacked metal layers separated by dielectric layers;
- a first capacitor plate having, in each of at least two of the stacked metal layers, a plurality of fingers extending from an end portion;
- a second capacitor plate having, in each of the at least two stacked metal layers, a plurality of fingers extending from a different end portion and alternating with the fingers of the first capacitor plate in each layer;
- in each of the at least two stacked metal layers, dielectric material separating the alternating fingers of the first and second capacitor plates in the layer;
- a plurality of vias interconnecting fingers of the first capacitor plate in different ones of the metal layers;
- a plurality of vias interconnecting fingers of the second capacitor plate in different ones of the metal layers;
- in one of the stacked metal layers, a first connecting pin coupled to the interconnecting fingers of the first capacitor plate; and
- in one of the stacked metal layers, a second connecting pin coupled to the interconnecting fingers of the second capacitor plate, the connecting pins being located on a common side of the fringe capacitor and separated from each other by dielectric material; and
  - wherein the connecting pins are in a single one of the stacked metal layers.

9. The fringe capacitor of claim 8, wherein one of the connecting pins is in a stacked metal layer that forms a return path for one of the capacitor plates, with an end of the return path that is opposite the one of the connecting pins coupled to the end portion of the one of the capacitor plates.

10. The fringe capacitor of claim 8, wherein one of the stacked metal layers includes a plurality of fingers that are not coupled to an end portion, and that are coupled to fingers in another one of the other stacked metal layers by vias.

11. A media communications system comprising:
- a media presentation device configured to receive and present at least one of audio and video data to a user;
- a media source device configured to communicate at least one of the audio and video data to the media presentation device; and
- each of the media source device and the media presentation device respectively having a transceiver circuit for sending and receiving the at least one of audio and video data, the transceiver circuit including a fringe capacitor according to claim 1.

12. The system of claim 11, wherein the media source device and the media presentation are respectively configured to send and receive the at least one of audio and video data at frequencies above 60 GHz.

13. The system of claim 11, wherein each of the first and second capacitive circuits has a plurality of finger-like extensions in each metal layer of the device, the finger-like extensions of each capacitive circuit being arranged in an alternating pattern of fingers from each capacitive circuit, no finger being immediately adjacent another finger from the same capacitive circuit.

* * * * *